United States Patent
Baek et al.

(10) Patent No.: US 11,664,382 B2
(45) Date of Patent: May 30, 2023

(54) MEMORY DEVICE INCLUDING DOUBLE PN JUNCTIONS AND DRIVING METHOD THEREOF, AND CAPACITOR-LESS MEMORY DEVICE INCLUDING DOUBLE PN JUNCTIONS AND CONTROL GATES AND OPERATION METHOD THEREOF

(71) Applicant: POSTECH Research and Business Development Foundation, Pohang-si (KR)

(72) Inventors: Chang-Ki Baek, Pohang-si (KR);
Gayoung Kim, Pohang-si (KR);
Byoung-Don Kong, Pohang-si (KR);
Hyangwoo Kim, Gimcheon-si (KR)

(73) Assignee: POSTECH RESEARCH AND BUSINESS DEVELOPMENT FOUNDATION, Pohang-si (KR)

( * ) Notice: Subject to any disclaimer, the term of this patent is extended or adjusted under 35 U.S.C. 154(b) by 63 days.

(21) Appl. No.: 17/354,910

(22) Filed: Jun. 22, 2021

(65) Prior Publication Data

US 2022/0028857 A1  Jan. 27, 2022

(30) Foreign Application Priority Data

Jul. 27, 2020  (KR) .......................... 10-2020-0093129

(51) Int. Cl.
*G11C 11/34* (2006.01)
*H01L 27/102* (2023.01)
*G11C 11/39* (2006.01)

(52) U.S. Cl.
CPC ......... *H01L 27/1027* (2013.01); *H10B 12/00* (2023.02); *G11C 11/39* (2013.01)

(58) Field of Classification Search
CPC .... H01L 27/1027; H01L 27/108; G11C 11/39
(Continued)

(56) References Cited

U.S. PATENT DOCUMENTS 3,623,925 A * 11/1971 Jenkins et al. ...... H01L 27/0766
257/E27.032
3,733,690 A *  5/1973 Rizzi ...................... G11C 17/06
438/351
(Continued)

FOREIGN PATENT DOCUMENTS

| KR | 10-2006-0120437 A | 11/2006 |
|----|-------------------|---------|
| KR | 10-2007-0024701 A | 3/2007  |
| KR | 10-2036595 B1     | 10/2019 |

*Primary Examiner* — Viet Q Nguyen
(74) *Attorney, Agent, or Firm* — Morgan, Lewis & Bockius LLP

(57) ABSTRACT

A memory device includes at least one semiconductor layer having a double PN junction, and an anode and a cathode which simultaneously contact the semiconductor layer, wherein a junction between the semiconductor layer and the anode is a Schottky junction, and a junction between the semiconductor layer and the cathode is an Ohmic junction. In addition, a capacitor-less memory device includes at least one semiconductor layer including a double PN junction, a control gate which contacts the semiconductor layer, and an anode and a cathode which simultaneously contact the semiconductor layer, wherein a junction between the semiconductor layer and the anode is a Schottky junction, and a junction between the semiconductor layer and the cathode is an Ohmic junction. Methods of operating the memory device and the capacitor-less memory device are also disclosed.

13 Claims, 15 Drawing Sheets

(58) Field of Classification Search
USPC .......................................................... 365/174
See application file for complete search history.

(56) References Cited

U.S. PATENT DOCUMENTS

| | | | | |
|---|---|---|---|---|
| 3,918,033 A * | 11/1975 | Case | ........................ | G11C 11/39 |
| | | | | 365/174 |
| 3,996,656 A * | 12/1976 | Cook, Jr. | ................. | H01L 29/04 |
| | | | | 257/E29.05 |
| 4,024,564 A * | 5/1977 | Shimada | ................ | H01L 29/402 |
| | | | | 257/652 |
| 4,656,495 A * | 4/1987 | Birrittella | ........... | H01L 21/8229 |
| | | | | 257/512 |
| 4,719,501 A * | 1/1988 | Nakagawa | ............... | H01L 31/18 |
| | | | | 257/E29.32 |
| 4,876,220 A * | 10/1989 | Mohsen | ............ | H01L 21/76886 |
| | | | | 438/467 |
| 4,881,114 A * | 11/1989 | Mohsen | ............ | H01L 21/76886 |
| | | | | 365/96 |
| 4,982,258 A * | 1/1991 | Baliga | ................. | H01L 29/7455 |
| | | | | 257/608 |
| 5,055,889 A * | 10/1991 | Beall | ........................ | H01L 29/93 |
| | | | | 331/177 V |
| 5,254,869 A * | 10/1993 | Readdie | ................. | H01L 29/872 |
| | | | | 257/E29.338 |
| 7,052,941 B2 * | 5/2006 | Lee | ..................... | H01L 27/0688 |
| | | | | 438/153 |
| 8,461,563 B2 * | 6/2013 | Yasuda | ................ | H01L 27/2409 |
| | | | | 257/497 |
| 8,927,955 B2 * | 1/2015 | Sonehara | ............ | H01L 27/2409 |
| | | | | 257/536 |
| 8,957,458 B2 * | 2/2015 | Widjaja | ............... | H01L 29/7841 |
| | | | | 257/E27.07 |
| 9,117,739 B2 * | 8/2015 | Zhang | ................... | H01L 29/872 |
| 10,700,131 B2 * | 6/2020 | Bertin | ................... | H01L 27/249 |
| 10,727,060 B2 * | 7/2020 | Iguchi | .................... | H01L 29/861 |
| 2002/0050606 A1 | 5/2002 | Buerger, Jr. | | |
| 2008/0239803 A1 | 10/2008 | Cho | | |
| 2008/0261380 A1 * | 10/2008 | Lee | ........................ | H01L 24/29 |
| | | | | 257/E21.505 |
| 2011/0260131 A1 * | 10/2011 | Sonehara | ........... | H01L 27/2481 |
| | | | | 257/E47.001 |
| 2012/0061639 A1 | 3/2012 | Yasuda | | |
| 2012/0176831 A1 | 7/2012 | Xiao et al. | | |
| 2013/0009165 A1 * | 1/2013 | Park | .................... | H01L 27/0629 |
| | | | | 257/E21.403 |
| 2013/0134383 A1 * | 5/2013 | Hwang | ............... | H01L 27/2481 |
| | | | | 257/5 |

* cited by examiner

| Operation mode | $V_A$ | Word line (WL), $V_G$ | | Bit line (BL), $V_C$ | |
|---|---|---|---|---|---|
| | | Selected | Unselected | Selected | Unselected |
| Standby | 1.3 V | 0.0 V | | 0.0 V | |
| Program | | 0.0 V | -1.0 V | -1.0 V | 0.0 V |
| Erase | | 1.0 V | 0.0 V | 0.0 V | 1.0 V |
| Read | | -0.8 V | | -1.0 V | 0.0 V |

MEMORY DEVICE INCLUDING DOUBLE PN JUNCTIONS AND DRIVING METHOD THEREOF, AND CAPACITOR-LESS MEMORY DEVICE INCLUDING DOUBLE PN JUNCTIONS AND CONTROL GATES AND OPERATION METHOD THEREOF

TECHNICAL FIELD

The present disclosure relates to a memory device including a Schottky junction and its operation method, and more particularly, to a memory device including a double PN junction, having a very simple structure in which a Dynamic Random Access Memory (DRAM) does not require a high aspect ratio capacitor which physically stores electrons, and its operation method.

In addition, the present disclosure relates to a capacitor-less memory device including a double PN junction and a control gate and its operation method, and more particularly, to a capacitor-less memory device including a double PN junction and a control gate, having a very simple structure without requiring a high aspect ratio capacitor as opposed to an existing 1transistor-1capacitor (1T-1C) DRAM, and its operation method.

BACKGROUND ART

A Dynamic Random Access Memory (DRAM) is the most representative memory device among semiconductor devices and includes a field-effect transistor for selecting a specific memory cell and a capacitor which stores carriers, and thus DRAMs are being widely used in industrial devices, for example, computers, electronic product, communication devices or the like. With the development of technology, the required data storage capacity of the memory device dramatically increases, and to develop a high capacity memory device, attempts have been made to reduce the size of the memory cell. To reduce the size of the memory cell, it is necessary to develop a high aspect ratio capacitor with high capacitance in a small area, but this poses stability and reliability problems, resulting in the increased process complexity and process cost. That is, since the existing 1T-1C DRAM needs a capacitor, there are limitations in reducing the size of the memory cell and achieving high integrity.

To overcome the limitations of the existing 1T-1C structure-based DRAM, various types of capacitor-less DRAM devices capable of storing carriers in the devices without capacitors have been suggested.

Among them, a 2-terminal Thyristor Random Access Memory (TRAM) of a P-N-P-N structure including a P-type anode region, an N-type base region, a P-type base region and an N-type cathode region is introduced.

This memory can be used as a DRAM cell by storing carriers in the N-type base and the P-type base, not storing charges in a capacitor, so it is possible to reduce the size of the memory device and achieve high integrity. However, for stable TRAM operation, the N-type and P-type base regions of sufficient lengths are required, so there are many limitations in reducing the size of the device. Additionally, there are procedural difficulties since abrupt doping profiles are required in each of a junction between the P-type anode region and the N-type base region, a junction between the N-type base region and the P-type base region and a junction between the P-type base region and the N-type cathode region of the TRAM. Furthermore, when a memory array is formed using a 2-terminal capacitor-less DRAM, for example, a 2-terminal TRAM, during the read/write operation of a specific memory cell, a "disturbance" voltage may be inevitably applied to other memory cells at the same bit line and the same word line, causing a fatal reliability problem such as damage to data stored in adjacent memory cells.

Additionally, a switchable memory diode including a Schottky junction and an Ohmic junction at two terminals of a PN diode is introduced.

This memory has a simple structure including a diode including an active layer and a passive layer and a Schottky junction and an Ohmic junction at its two terminals, thereby effectively reducing the process complexity and greatly reducing the size of the device and the power consumption. However, since the performance of the memory device is greatly dependent on the Schottky barrier height, the selection of metal electrode materials is greatly limited. Moreover, even though a metal material having an optimal work function is used, defects at the metal-semiconductor interface may cause failure of the memory device operation or notable degradation in the operation performance.

Accordingly, there is still a need for a capacitor-less memory structure which is advantageous for process cost savings of a DRAM as well as the reduced size of the memory device and improved memory characteristics and reliability and its operation method.

DISCLOSURE

Technical Problem

The present disclosure is directed to providing a method for fabricating and operating a memory device with high performance and high integrity by avoiding high electric fields at semiconductor junctions and reliance on a metal electrode material requiring a specific work function when forming a Schottky junction.

The present disclosure is further directed to providing a high integrity and high reliability memory device which has a simple structure without the need for a capacitor, thereby achieving high integrity, and avoids "disturbance" of adjacent devices in a memory operation by applying a control gate, and its operation method.

Technical Solution

To solve the above-described problem, the present disclosure provides a memory device including a double PN junction, comprising at least one semiconductor layer having a double PN junction, and an anode and a cathode which simultaneously contact the semiconductor layer, wherein a junction between the semiconductor layer and the anode is a Schottky junction, and a junction between the semiconductor layer and the cathode is an Ohmic junction.

In an embodiment of the present disclosure, the semiconductor layer is an NPN or PNP-type semiconductor layer.

In an embodiment of the present disclosure, the memory layer is an NPN-type, and one of the N-type semiconductor layers is low concentration and the other is high concentration.

In an embodiment of the present disclosure, the low concentration N-type memory layer contacts the anode and the high concentration N-type memory layer contacts the cathode, and a junction between the anode and the low concentration N-type memory layer is a Schottky junction and a junction between the high concentration N-type memory layer and the cathode is an Ohmic junction.

Additionally, the present disclosure provides a memory device array comprising the above-described memory device as a unit device.

Additionally, the present disclosure provides an operation method of a memory device including a double PN junction, comprising applying a program voltage to the memory device, lowering resistance of the semiconductor layer by lowering a potential barrier of the double PN junction by the program voltage to move carriers to the semiconductor layer, and reading the resistance of the semiconductor layer, wherein the memory device including a double PN junction comprises at least one semiconductor layer having a double PN junction, and an anode and a cathode which simultaneously contact the semiconductor layer, wherein a junction between the semiconductor layer and the anode is a Schottky junction and a junction between the semiconductor layer and the cathode is an Ohmic junction.

In an embodiment of the present disclosure, the operation method of a memory device further comprises, after lowering the resistance of the semiconductor layer, increasing the resistance of the semiconductor layer by selectively applying an erase voltage to the memory device, and further comprises, after applying the program voltage, re-lowering the resistance of the semiconductor layer by selectively re-applying a refresh voltage to the memory device.

Meanwhile, to solve the above-described problem, the present disclosure provides a capacitor-less memory device, comprising at least one semiconductor layer having a double PN junction, a control gate which contacts the semiconductor layer, and an anode and a cathode which simultaneously contact the semiconductor layer, wherein a junction between the semiconductor layer and the anode is a Schottky junction, and a junction between the semiconductor layer and the cathode is an Ohmic junction.

In an embodiment of the present disclosure, the semiconductor layer is an NPN-type, one of the N-type semiconductor layers is low concentration and the other is high concentration, and the low concentration N-type semiconductor layer contacts the anode and the high concentration N-type semiconductor layer contacts the cathode.

In an embodiment of the present disclosure, the low concentration N-type memory layer contacts the anode, and the high concentration N-type memory layer contacts the cathode.

Additionally, the present disclosure provides a memory device array comprising the above-described memory device as a unit device.

Additionally, the present disclosure provides an operation method of a capacitor-less memory device including a double PN junction and a control gate, comprising applying a program voltage to the memory device, lowering resistance of the semiconductor layer by lowering a potential barrier of the double PN junction by the program voltage to move carriers to the semiconductor layer, and reading the resistance of the semiconductor layer, wherein the capacitor-less memory device including a double PN junction and a control gate comprises at least one semiconductor layer having a double PN junction, and an anode and a cathode which simultaneously contact the semiconductor layer, wherein a junction between the semiconductor layer and the anode is a Schottky junction and a junction between the semiconductor layer and the cathode is an Ohmic junction.

In an embodiment of the present disclosure, the semiconductor layer is an NPN-type, one of the N-type semiconductor layers is low concentration and the other is high concentration, and the low concentration N-type semiconductor layer contacts the anode and the high concentration N-type semiconductor layer contacts the cathode.

In an embodiment of the present disclosure, the operation method of a capacitor-less memory device further comprises, after lowering the resistance of the semiconductor layer, increasing the resistance of the semiconductor layer by selectively applying an erase voltage to the memory device, and further comprises inhibiting, by the control gate, an operation error of an unselected cell in a memory cell array configuration formed using the memory device.

Advantageous Effects

According to an embodiment of the present disclosure, a memory device includes a semiconductor layer including a double PN junction (an NPN junction and a PNP junction) and an anode and a cathode in contact with the semiconductor layer to form a Schottky junction and an Ohmic junction, respectively. In this case, when a program voltage is applied, carriers accumulate in the semiconductor layer, the semiconductor layer has low resistance, and the low resistance of the semiconductor layer is maintained in the semiconductor layer for a predetermined time before an erase voltage is applied.

In case that the anode and the P-type semiconductor layer form a Schottky junction with no N-type semiconductor layer sandwiched between, since the performance of the memory device is greatly dependent on the height of the Schottky barrier, so the selection of metal electrode materials is greatly limited. Additionally, defects at the metal-semiconductor interface accelerate the recombination of carriers stored in the P-type semiconductor layer, resulting in notable degradation in the memory operation performance.

In contrast, the memory device according to an embodiment of the present disclosure has a structure in which an N-type semiconductor layer is sandwiched between a P-type semiconductor layer and an anode forming a Schottky junction, carriers stored in the P-type semiconductor layer are greatly affected by the potential barrier at an NP junction, and the potential barrier can be easily controlled through the control of the concentration of impurities included in the N-type semiconductor layer. Additionally, since the P-type semiconductor layer does not come in direct contact with the metal electrode and forms an NP junction with the N-type semiconductor layer, the stored carriers are not affected by defects at the metal-semiconductor interface, thereby ensuring the outstanding operation performance of the memory device. Accordingly, the memory device including a double PN junction according to an embodiment of the present disclosure can easily overcome the limitation of the limited selection of electrode materials for determining the Schottky barrier height, thereby improving the usage possibility, and as opposed to the above-described inventions, it is possible to avoid the degradation of the device caused by high electric field applied to the junction, thereby ensuring the reliable operation performance.

Additionally, according to an embodiment of the present disclosure, a memory device includes an anode, a semiconductor layer including a double PN junction (an NPN junction and a PNP junction) and a cathode, the anode and the cathode in contact with the semiconductor layer form a Schottky junction and an Ohmic junction respectively, and a control gate is formed on the semiconductor layer. When a program voltage is applied, carriers accumulate in the semiconductor layer and the semiconductor layer has low resistance, and the low resistance of the semiconductor layer is maintained in the semiconductor layer for a predetermined time before an erase voltage is applied.

As described above, the memory device of the present disclosure does not require a capacitor, has a simple device structure and is easy to vertically fabricate, making it possible to greatly improve the integrity of the memory device compared to the existing DRAMs. Additionally, as opposed to the existing 2-terminal capacitor-less DRAMs vulnerable to "disturbance" voltages, it is possible to protect data in adjacent memory devices by controlling carriers accumulated in the semiconductor layer through the control gate, thereby achieving reliability of the memory array operation.

DESCRIPTION OF DRAWINGS

FIG. 23 is an energy band diagram of a memory device of an embodiment by the application of program disturbance pulses to an unselected cell during the program operation of FIG. 22.

FIG. 24 shows the stored hole concentration ($N_P$) in a memory device of an embodiment by repetition of erase disturbance pulses applied to an unselected cell during the erase operation of FIG. 22.

FIG. 25 shows the operating voltage and the anode current of a memory device of an embodiment by the repeated application of read pulses 10 times after the erase operation of FIG. 22.

BEST MODE

Figure 1:
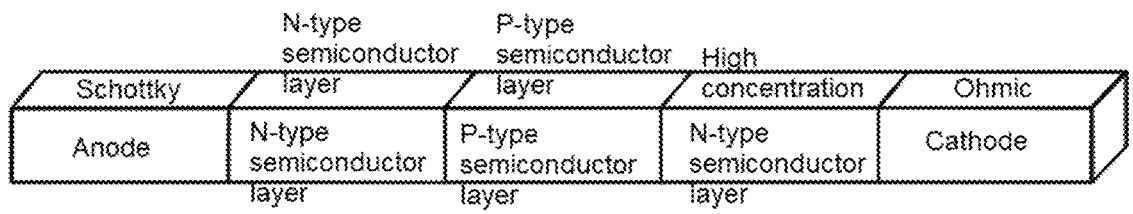
FIG. 1 is a diagram of a memory device according to an embodiment of the present disclosure.

The present disclosure may be variously modified and have many different forms, and particular embodiments will be shown in the drawings and specifically described herein as below. However, it should be understood that this is not intended to limit the present disclosure to a particular disclosed embodiment and encompasses all modifications, equivalents or substitutes included in the spirit and scope of the present disclosure. In describing each drawing, like reference signs are used for like elements.

Unless otherwise defined, all terms (including technical and scientific terms) used herein have the same meaning as commonly understood by those skilled in the art. The terms, such as those defined in commonly used dictionaries, should be interpreted as having a meaning that is consistent with their meaning in the context of the relevant art document, and will not be interpreted in an idealized or overly formal sense unless expressly so defined herein.

Additionally, the terms anode, cathode, control gate, N-type region, P-type region, PN junction, Schottky junction and Ohmic junction as used herein are interpreted at the ordinary level, various changes may be made to the type, and such changes fall in the scope of the present disclosure. Additionally, the semiconductor layer is a device layer including a semiconductor material no matter whether it is horizontal or vertical, and encompasses any semiconductor structure including at least one NPN or PNP junction. Additionally, although the control gate is described as being disposed on the semiconductor layer, the structure is not limited to bottom or gate-all around, and encompasses any control gate structure that contacts the semiconductor layer. In the present disclosure, "capacitor-less" refers to no capacitor.

To solve the above-described problem, the present disclosure combines the energy barrier at the Schottky junction with the energy barrier at the PN or NP junction, to increase the usage possibility of the memory device by avoiding the reliance on the metal work function as opposed to comparative example using the energy barrier at the Schottky junction alone. Accordingly, the semiconductor layer of the memory device according to an embodiment of the present disclosure includes a double PN junction such as NPN or PNP, and one of them forms a Schottky junction with the anode and the other forms an Ohmic junction.

Additionally, to solve the above-described problem, the present disclosure includes an anode, a semiconductor layer including a double PN junction (an NPN junction and a PNP junction) and a cathode, the anode and the cathode in contact with the semiconductor layer form a Schottky junction and an Ohmic junction respectively, and a control gate is formed on the semiconductor layer. Accordingly, the simple device structure not requiring a capacitor may greatly improve the device integrity, and when a memory array is formed using the memory device, the disturbance problem between adjacent memory devices may be inhibited by the control gate, thereby achieving reliability of the memory array operation. Further, the present disclosure may protect data in adjacent memory devices by controlling carriers accumulated in the semiconductor layer through the control gate, thereby achieving reliability of the memory array operation.

Hereinafter, the present disclosure will be described in more detail using a memory device according to an embodiment of the present disclosure using an NPN-type semiconductor layer.

Figure 2:
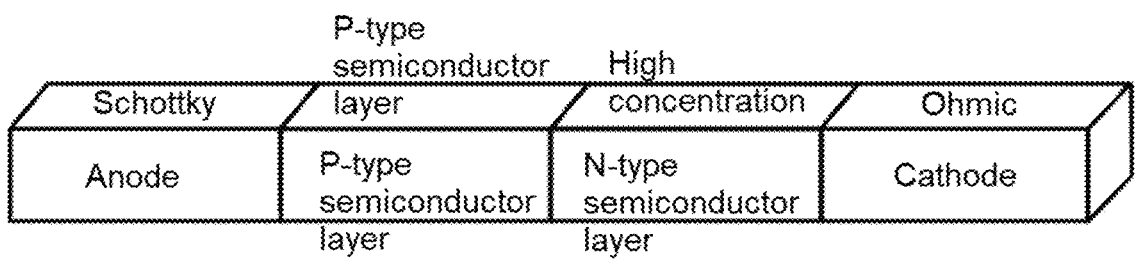
FIG. 2 is a diagram of a memory device having no N-type semiconductor layer between a P-type semiconductor layer and an anode as a comparative example.

FIG. 1 is a diagram of a memory device according to an embodiment of the present disclosure, and FIG. 2 is a diagram of a memory device according to comparative example.

Referring to FIGS. 1 and 2, the memory device according to an embodiment of the present disclosure uses an NPN semiconductor layer including an NP junction, in which an N-type semiconductor layer is sandwiched between an anode and a semiconductor layer including a PN junction, and the anode forms a Schottky junction with the NPN semiconductor layer and the cathode forms an Ohmic junction with the N-type semiconductor layer. The memory device of FIG. 2 of comparative example has a structure in which an anode and a P-type semiconductor layer form a Schottky junction, and an N-type semiconductor layer and a cathode form an Ohmic junction.

The NPN-type memory device according to an embodiment of the present disclosure has a structure in which a high concentration N-type semiconductor layer contacts the cathode, and a low concentration N-type semiconductor contacts the anode.

In case that the low concentration N-type semiconductor layer contacts the cathode, a Schottky junction rather than an Ohmic junction is formed, and in this case, sufficient electrons for impact ionization in the semiconductor layer may not be supplied from the cathode. Additionally, in case that the high concentration N-type semiconductor layer contacts the anode, the memory erase operation may fail. That is, in case that the high concentration N-type semiconductor layer contacts the anode, an Ohmic junction may be formed, and in this case, when a negative voltage is applied to the anode, electron transport and impact ionization occurs, leading to carrier accumulation.

The gravest problem of comparative example shown in FIG. 2 is that the resistance state retention performance of the memory device may be greatly dependent on the height of Schottky barrier.

A different in the retention time $T_{ret}$ as a function of Schottky barrier energy (Barrier Potential, $\varphi_{Bp}$) in the memory device of the structure of FIG. 2 is as follows.

$\varphi_{Bp}$=0.966 eV→$T_{ret}$=300 ms, $\varphi_{Bp}$=0.815 eV→$T_{ret}$=3 ms Referring to the above result, it can be seen that the difference of 0.15 eV makes a difference to the retention time about 100 times. For the stable operation of the memory device, it is necessary to precisely control the energy barrier at the Schottky junction, and eventually, this limits the selection of anode materials. Additionally, even though there is a metal material having an optimal work function, the operation of the memory device may fail or the performance may greatly degrade due to defects formed at the interface of the anode metal electrode and the P-type semiconductor layer in the fabrication of the device.

FIGS. 3 to 6 are energy band diagrams illustrating the operating mechanism of the memory device (NPN$^+$) according to an embodiment of the present disclosure. Here, the Schottky barrier height is set to 0.815 eV.

Figure 3:
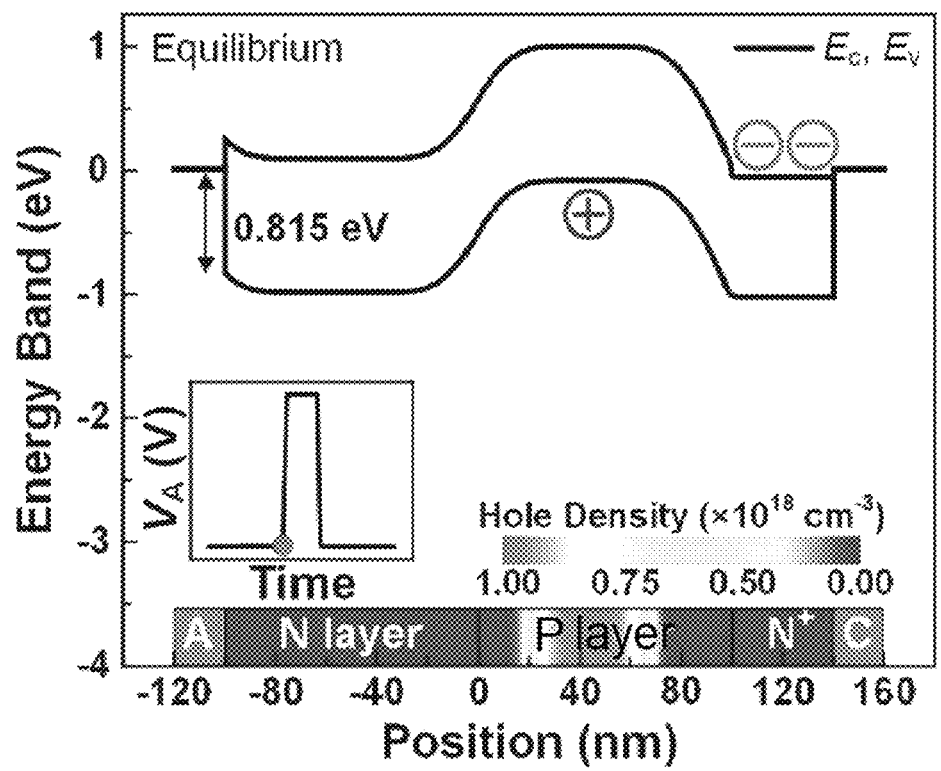
FIGS. 3 to 6 are energy diagrams illustrating an operating mechanism of a memory device (NPN+) according to an embodiment of the present disclosure.

FIG. 3 is an energy band diagram when the anode voltage of 0 V (an equilibrium state) is applied. The energy barrier at the PN$^+$ junction is high, leading to High Resistance State (HRS) representing low current. In comparative example, the energy barrier at the Schottky junction is determined by the work function of the anode, while the memory device including a double PN junction according to an embodiment of the present disclosure may adjust the energy barrier height at the NP junction by adjusting the doping concentration of the N-type semiconductor layer in contact with the anode. Additionally, since the NP junction has the lower defect concentration than the metal contact interface, it is easy to ensure the outstanding retention time performance of the fabricated memory device.

Figure 4:
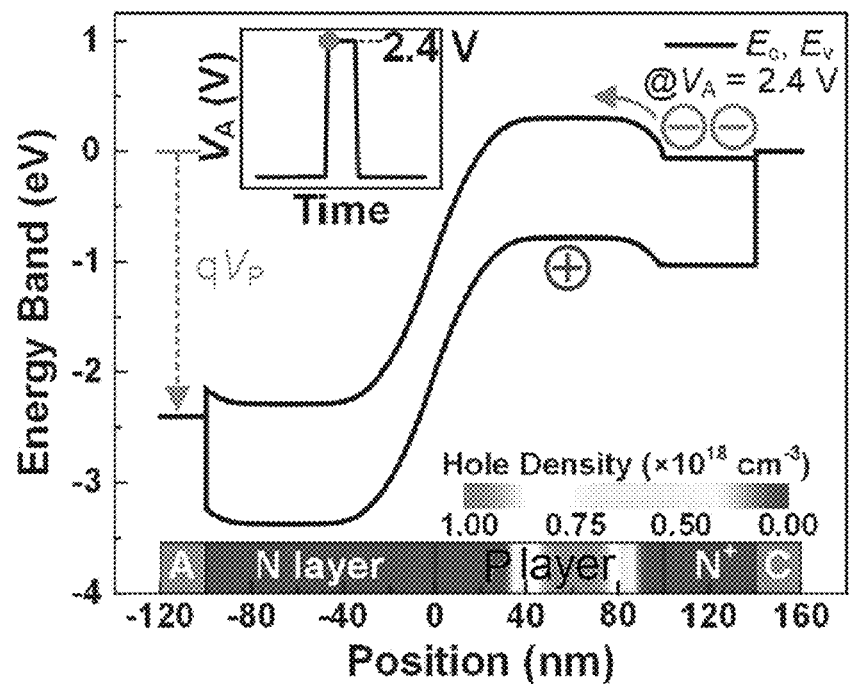

FIG. 4 is an energy band diagram when the anode voltage of 2.4 V (a trigger voltage of program operation) is applied. By the application of the anode voltage, the energy barrier at the Schottky junction and the PN$^+$ junction is lowered. Subsequently, electrons in the high concentration N-type semiconductor layer N$^+$ are transported to the anode across the P-type semiconductor layer.

Figure 5:
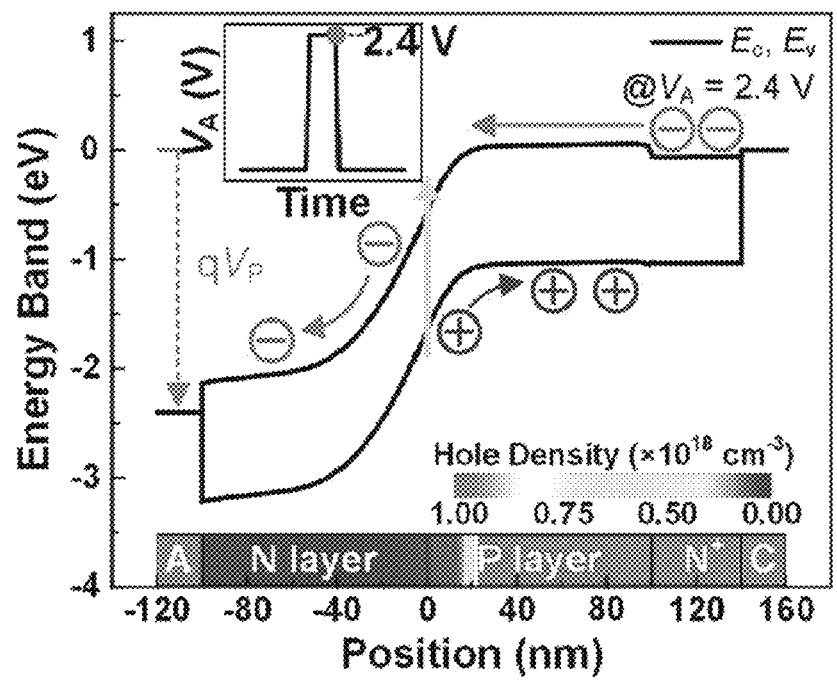

FIG. 5 shows an energy band when the anode voltage is maintained at 2.4 V (a trigger voltage of program operation) for the pulse duration. Referring to FIG. 5, the impact ionization effect by the high electric field at the NP junction generates electrons and holes, and in this instance, the generated electrons accumulate in the N-type region and are maintained for a predetermined time, and the generated holes accumulate in the P-type region, which lowers the potential barrier. In this instance, the lowered potential barrier leads to Low Resistance State (LRS) in which electrons can easily move.

Figure 6:
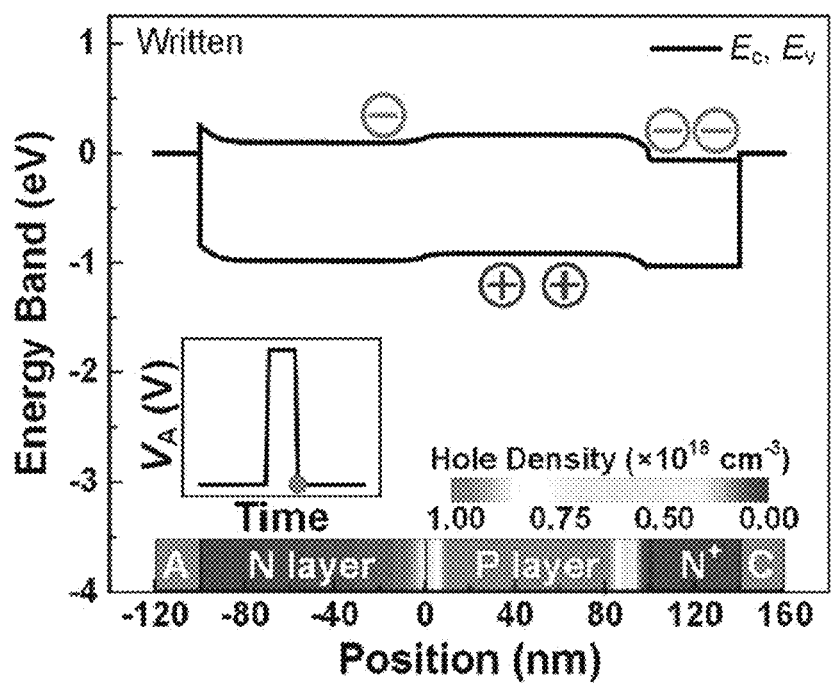
Figure 7:
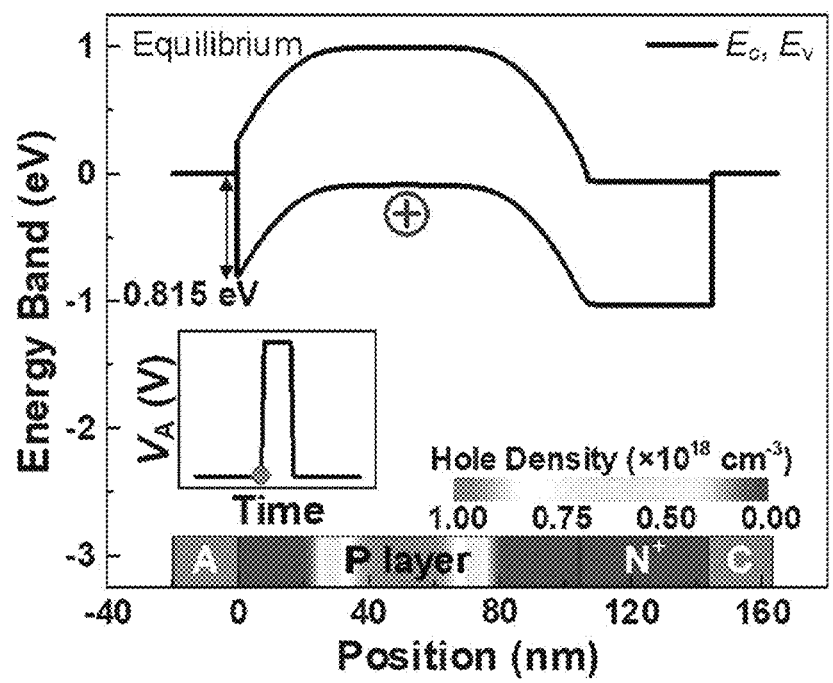
FIGS. 7 to 10 are energy diagrams illustrating an operating mechanism of a memory device having no N-type semiconductor layer between a P-type semiconductor layer and an anode.
Figure 8:
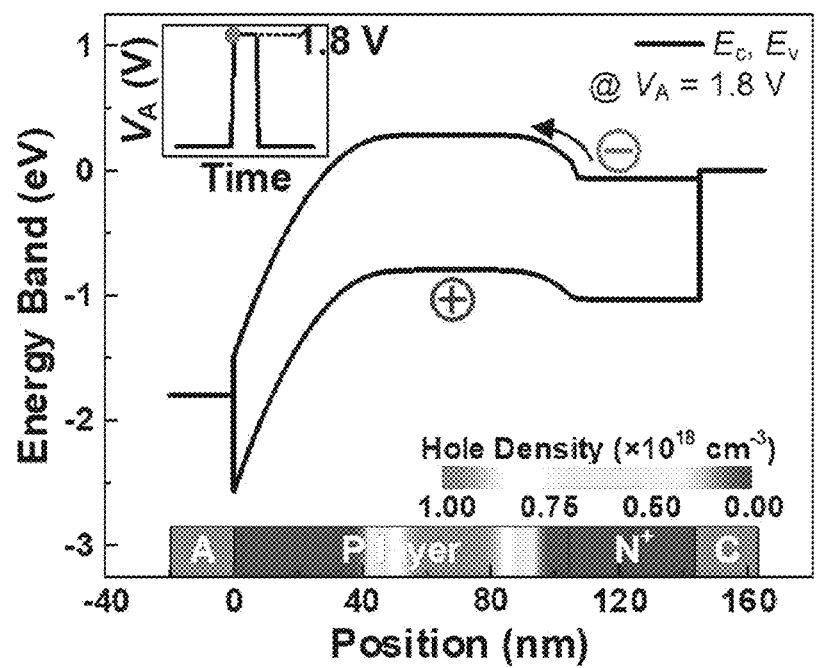

FIG. 6 is an energy band diagram when the anode voltage reduces from 2.4 V (a trigger voltage of program operation) to 0 V. The anode voltage is lowered, but holes accumulate in the P-type semiconductor layer and the low energy barrier is maintained. In this instance, since the present disclosure has a structure in which the N-type semiconductor layer is sandwiched, more holes accumulate after program, leading to lower energy barrier for electrons, and the retention time is 600 ms. This structure exhibits the same Schottky barrier height (0.815 eV) as comparative example, but may improve the retention time of stored holes by the energy barrier at the NP junction.

FIGS. 7 to 10 are energy diagrams illustrating an operating mechanism of the memory device having no N-type semiconductor layer between the P-type semiconductor layer and the anode according to comparative example. Here, the Schottky barrier height is set to 0.815 eV in the same way as an embodiment of the present disclosure.

Referring to FIGS. 7 to 10, when voltage (1.8 V) is applied to the anode for the program operation, the energy barrier at PN$^+$ is lowered, and electrons in the high concentration N-type semiconductor layer N$^+$ are transported to the anode across the P-type semiconductor layer.

Figure 9:
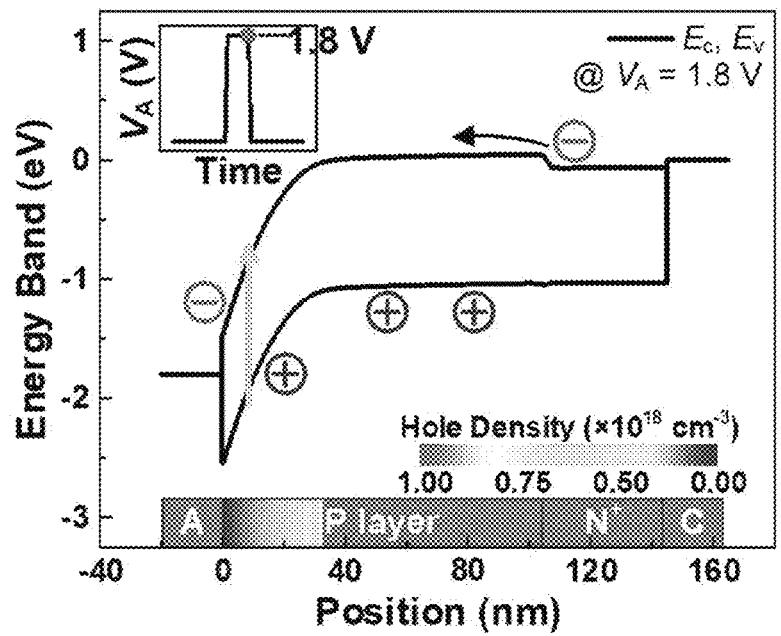

FIG. 9 is an energy band diagram when the anode voltage is maintained at 1.8 V (a trigger voltage of program operation) for the pulse duration. By the application of the anode voltage, more electrons flow, and high electric field of the anode and the P-type semiconductor layer generates electrons and holes through impact ionization.

Figure 10:
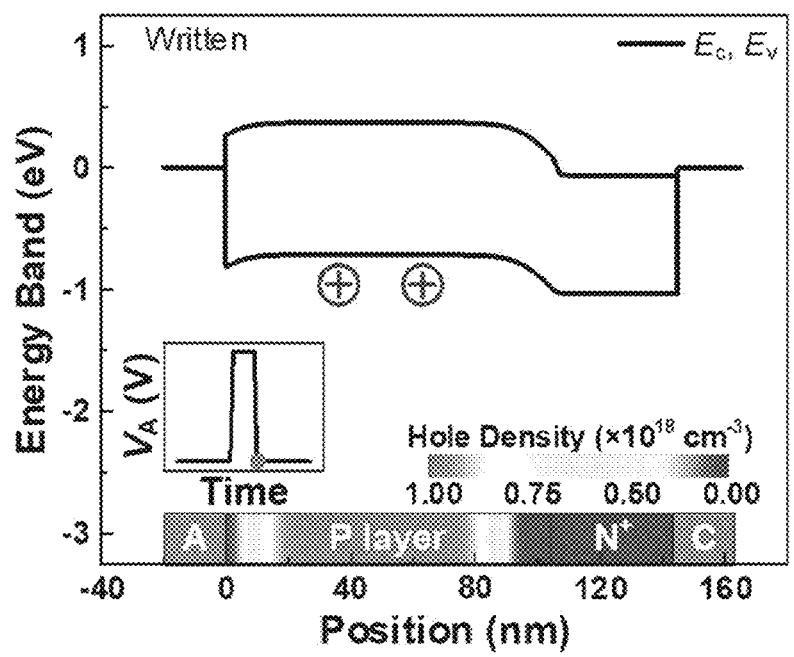

FIG. 10 is an energy band diagram when the anode voltage reduces from 1.8 V (a trigger voltage of program operation) to 0 V. The anode voltage is lowered, but holes accumulate in the P-type semiconductor layer and low energy barrier is maintained. The memory device according to comparative example exhibits the retention time of about 3 ms.

Figure 11:
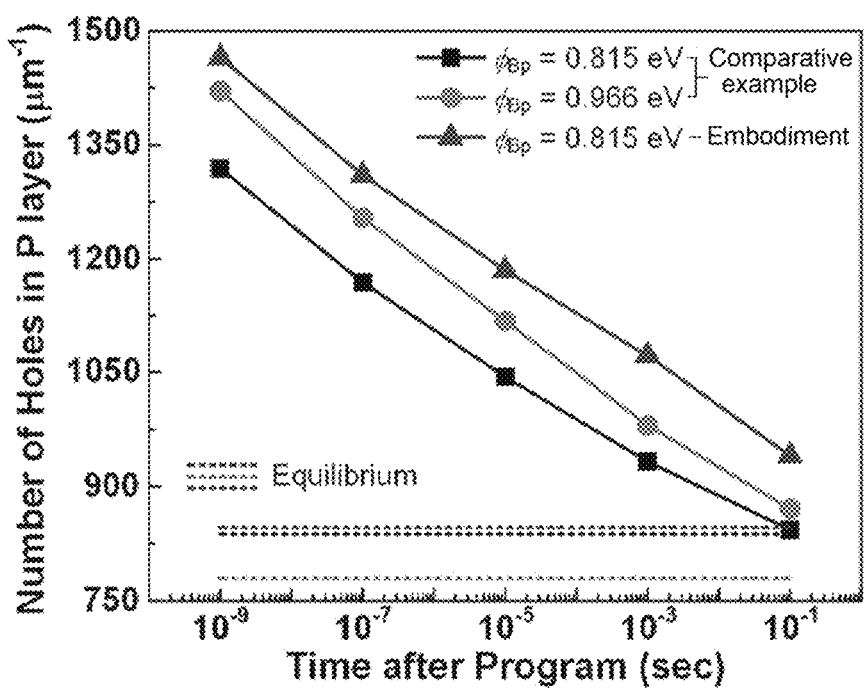
FIG. 11 shows the hole concentration in a P-type semiconductor layer of an embodiment and comparative examples over time after program.

FIG. 11 shows the concentration of holes accumulated in the P-type semiconductor layer in an embodiment and comparative examples over time after the program operation.

Referring to FIG. 11, as the energy barrier height $\varphi_{Bp}$ at the Schottky junction of comparative example reduces from 0.966 eV to 0.815 eV, holes accumulate at lower concentration after program, and the data retention time $T_{ret}$ reduces from 300 ms to 3 ms.

However, in the case of an embodiment having the N-type semiconductor layer, it can be seen that despite the low Schottky barrier height of 0.815 eV, the retention time $T_{ret}$ is significantly improved up to the level of 600 ms by the accumulation of more holes than comparative example after the program operation.

Figure 12:
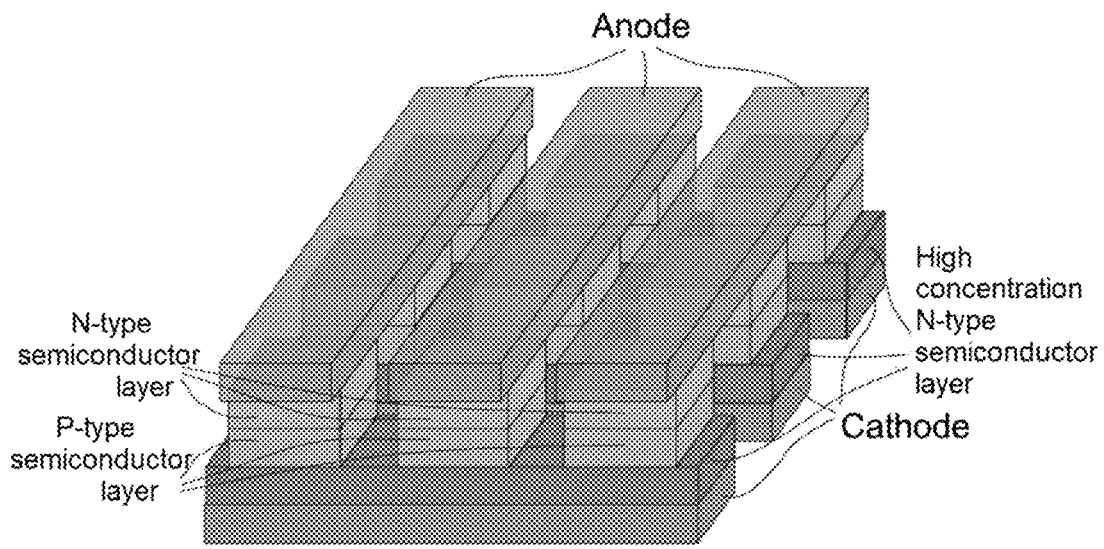
FIG. 12 is a diagram of a memory device array including the memory device of an embodiment as a unit device.

FIG. 12 is a diagram of a memory device array including the memory device of an embodiment as a unit device. Referring to FIG. 12, the memory device array including the memory device of an embodiment as a unit device is possible, and this is included in the scope of the present disclosure.

Additionally, the present disclosure provides an operation method of a memory device including a double PN junction. The operation method includes selectively applying a program voltage to at least one memory device including a double PN junction; lowering the resistance of the semiconductor layer by lowering the potential barrier of the semiconductor layer by the program voltage to move carriers to the semiconductor layer; selectively applying an erase voltage to the memory device; returning the resistance of the semiconductor layer back to the initial level by erasing the carriers in the semiconductor layer by the erase voltage; and reading the resistance of the semiconductor layer.

That is, the present disclosure may perform a data write operation by changing the resistance value of the semiconductor layer from high resistance to low resistance by the application of the program voltage to the memory device including the Schottky junction and changing the resistance value of the semiconductor layer from low resistance to high resistance by the application of the erase voltage. Additionally, the low resistance value of the semiconductor layer is maintained for a predetermined time after the program operation, and the resistance value of the semiconductor layer may be continuously maintained by selectively applying voltage (a refresh voltage) below the trigger voltage for the program operation within the retention time and the low resistance state of the semiconductor layer may be verified by applying the read voltage. That is, data in the memory device may be verified.

The memory device operation method may effectively perform data write, erase, read and retention without using a separate complex structure such as a capacitor.

Hereinafter, the present disclosure will be described in more detail using a memory device according to an embodiment of the present disclosure using an NPN-type semiconductor layer and a control gate.

Figure 13:
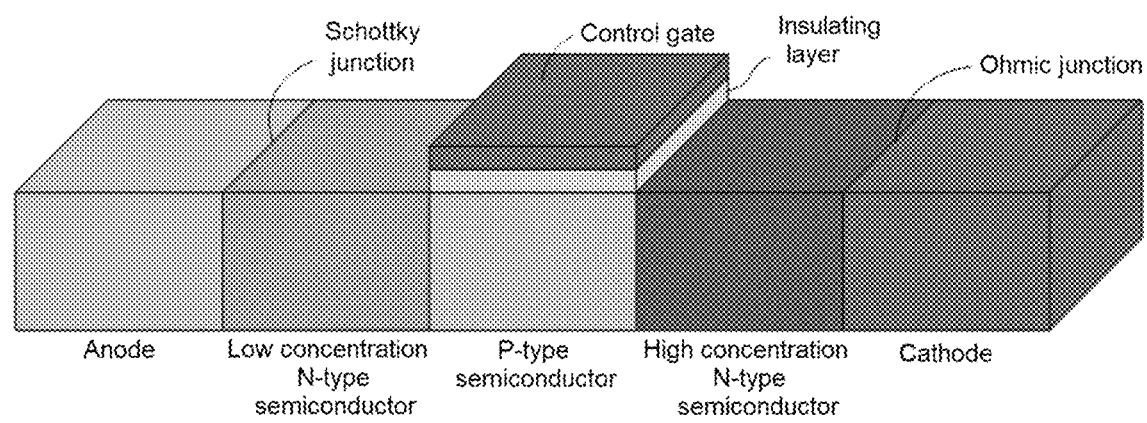
FIG. 13 is a diagram of a memory device according to an embodiment of the present disclosure.

FIG. 13 is a diagram of a memory device according to an embodiment of the present disclosure.

Referring to FIG. 13, the memory device according to an embodiment of the present disclosure includes an anode, an NPN semiconductor layer, a cathode and a control gate, the anode and the cathode in contact with the semiconductor layer form a Schottky junction and an Ohmic junction respectively, and the control gate is formed on the P-type semiconductor layer. Additionally, an insulating layer may be interposed between the P-type semiconductor layer and the control gate.

The NPN-type memory device according to an embodiment of the present disclosure has a structure in which the high concentration N-type semiconductor layer contacts the cathode, and the low concentration N-type semiconductor layer contacts the anode.

Since the high concentration N-type semiconductor layer forms an Ohmic junction with the cathode, sufficient electron sources are supplied through the cathode, and impact ionization may generate sufficient storage carriers for the memory operation.

Since the low concentration N-type semiconductor layer forms a Schottky junction with the anode, the energy barrier height of storage holes stored in the P-type semiconductor layer and the memory operating current may be adjusted by adjusting the doping concentration, and further, the doping concentration and the substantial operating characteristics of the device may be effectively controlled through the control gate.

Figure 14:
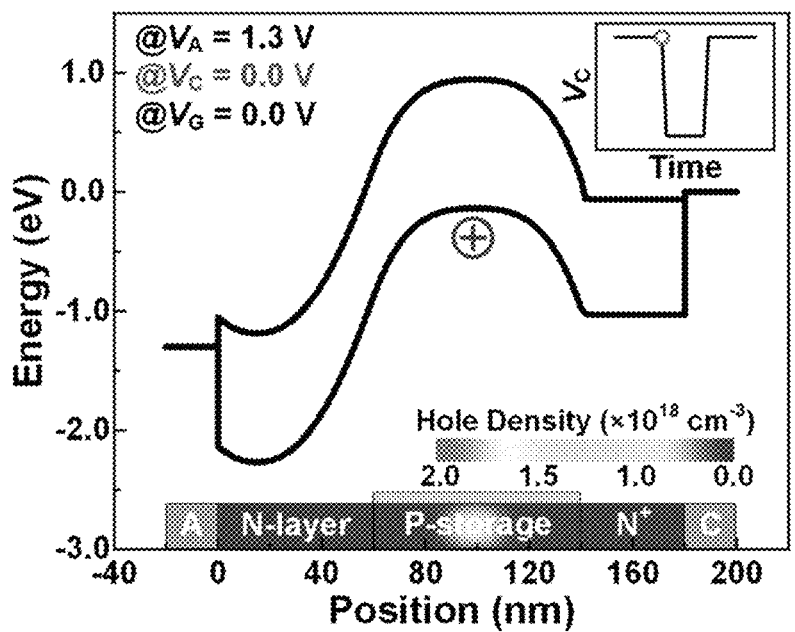
FIGS. 14 to 16 are energy diagrams illustrating a program operation mechanism of a memory device according to an embodiment of the present disclosure.
Figure 15:
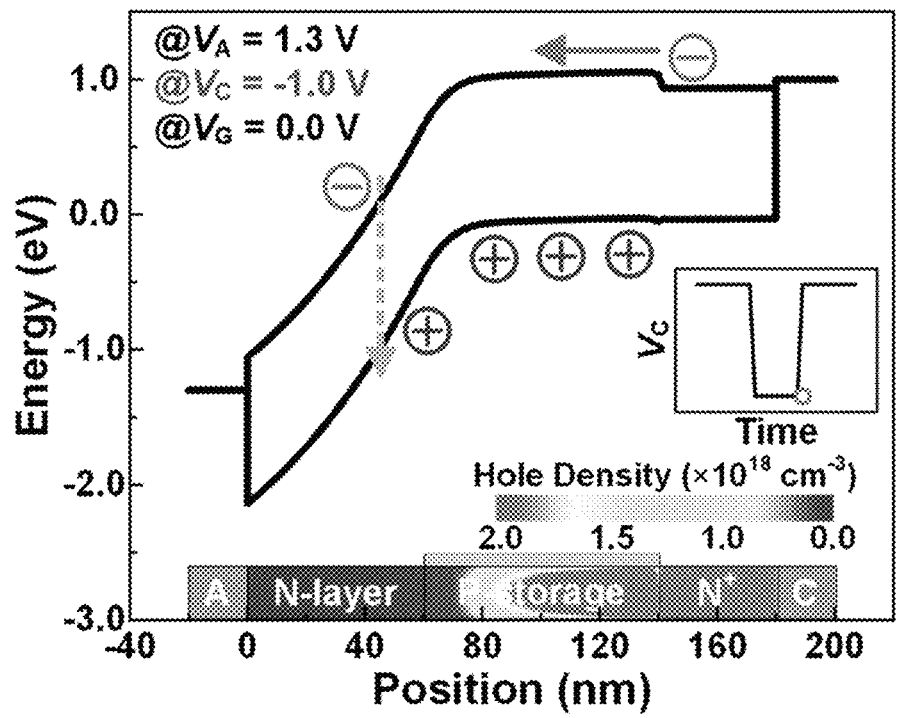
Figure 16:
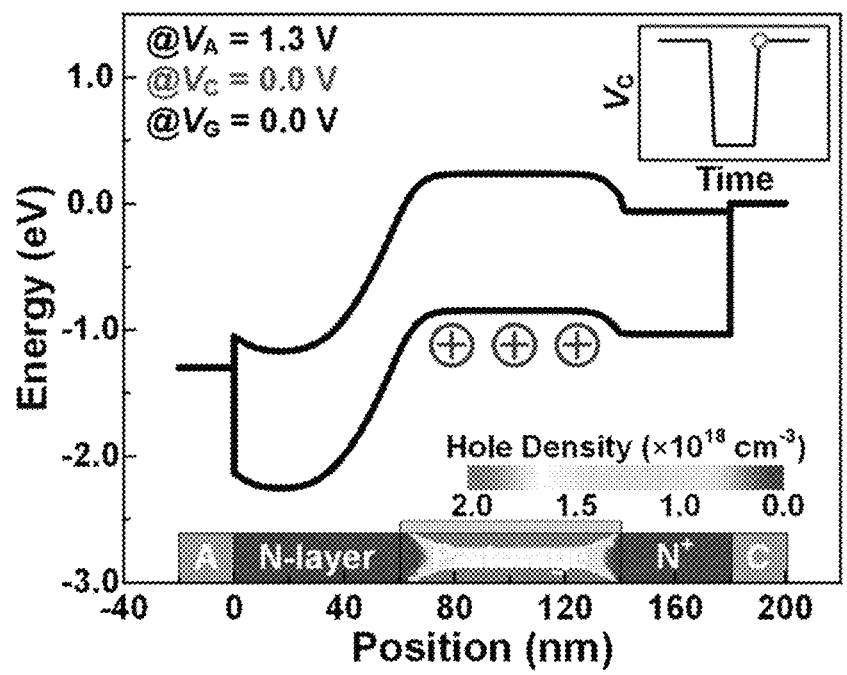

FIGS. 14 to 16 are energy diagrams illustrating the program operation mechanism of the memory device according to an embodiment of the present disclosure.

FIG. 14 is an energy band diagram before program when a standby state anode-cathode voltage $V_{AC, ST}$ (1.3 V) that is capable of maintaining Low Resistance State (LRS) after program is applied. Before program, the memory device has high energy barrier at the PN$^+$ junction and is in a High Resistance State (HRS) representing low current.

FIG. 15 is an energy band diagram when the cathode voltage of −1.0 V (a trigger cathode voltage of program operation) is applied. By the application of the cathode voltage of −1.0 V, anode-cathode voltage $V_{AC, P}$ of 2.3 V and gate-cathode voltage $V_{GC, P}$ of 1.0 V are applied to the memory device. When the negative cathode voltage is applied, the energy barrier at the Schottky junction and the PN$^+$ junction is lowered. Subsequently, electrons in the high concentration N-type semiconductor layer N$^+$ are transported to the anode across the P-type semiconductor layer. The impact ionization effect by the interaction between the transported electrons and the high electric field at the NP junction generates electrons and holes, and in this instance, the generated holes accumulate in the P-type region, which lowers the energy barrier at the PN$^+$ junction. In this instance, the lowered potential barrier leads to Low Resistance State (LRS) in which electrons can easily move.

FIG. 16 is an energy band diagram when the cathode voltage changes from −1.0 V (a trigger cathode voltage for program operation) back to the initial 0.0 V. The anode-cathode voltage $V_{AC}$ and the gate-cathode voltage $V_{GC}$ are reduced to 1.3 V and 0.0 V respectively, but the generated holes accumulate in the P-type semiconductor layer and the low PN$^+$ energy barrier is maintained.

Figure 17:
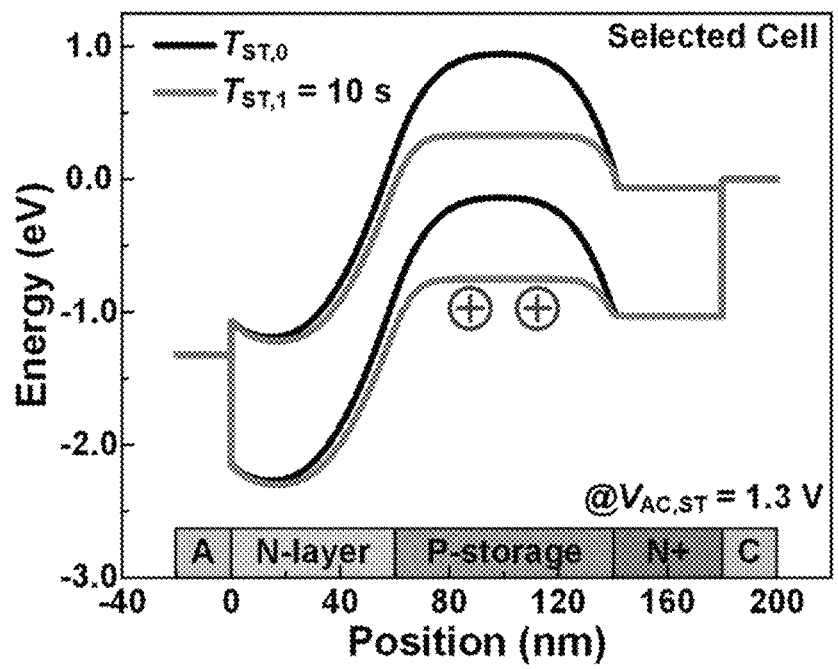
FIG. 17 is an energy band diagram of a memory device according to an embodiment before program ($T_{ST, 0}$) and 10 sec after program ($T_{ST, 1}$=10 s).

FIG. 17 is an energy band diagram of the memory device according to an embodiment before program ($T_{ST, 0}$) and 10 sec after program ($T_{ST, 1}$=10 s). Since the standby state anode-cathode voltage $V_{AC, ST}$ (1.3 V) that is capable of maintaining Low Resistance State (LRS) is applied to the memory device, the programmed device may maintain the Low Resistance State (LRS) even after 10 seconds.

Figure 18:
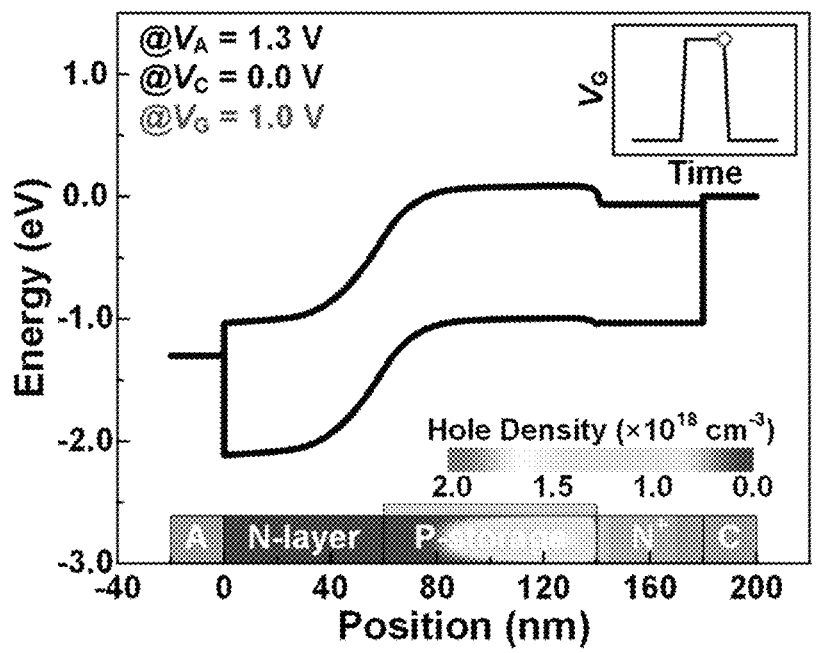
FIGS. 18 to 19 are energy diagrams illustrating an erase operation mechanism of a memory device according to an embodiment of the present disclosure.
Figure 19:
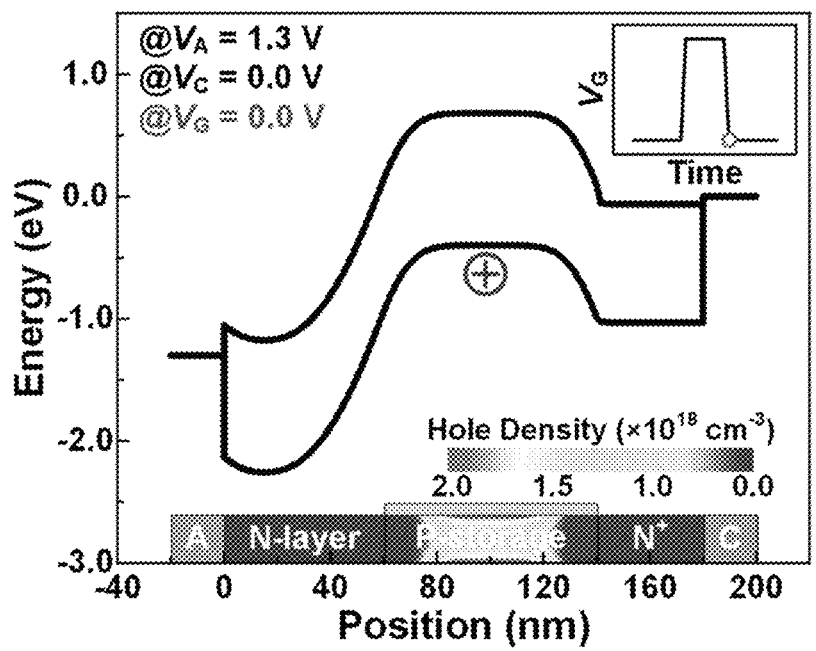

FIGS. 18 to 19 are energy diagrams illustrating the erase operation mechanism of the memory device according to an embodiment of the present disclosure.

FIG. 18 is an energy band diagram when 1.0 V (a gate voltage for erase operation) is applied to erase the holes stored in the P-type semiconductor layer of FIG. 16. By the application of the gate voltage of 1.0 V, gate-cathode voltage $V_{GC, E}$ of 1.0 V is applied to the memory device. In the memory device according to this embodiment, the stored holes in the P-type semiconductor layer are depleted by applying the positive gate voltage.

FIG. 19 is an energy band diagram when the gate voltage of 1.0 V (a gate voltage for erase operation) returns back to the initial 0.0 V. The energy barrier at the PN$^+$ junction is high due to the erased holes in the P-type semiconductor layer, and the memory state returns back to High Resistance State (HRS) before program.

Figure 20:
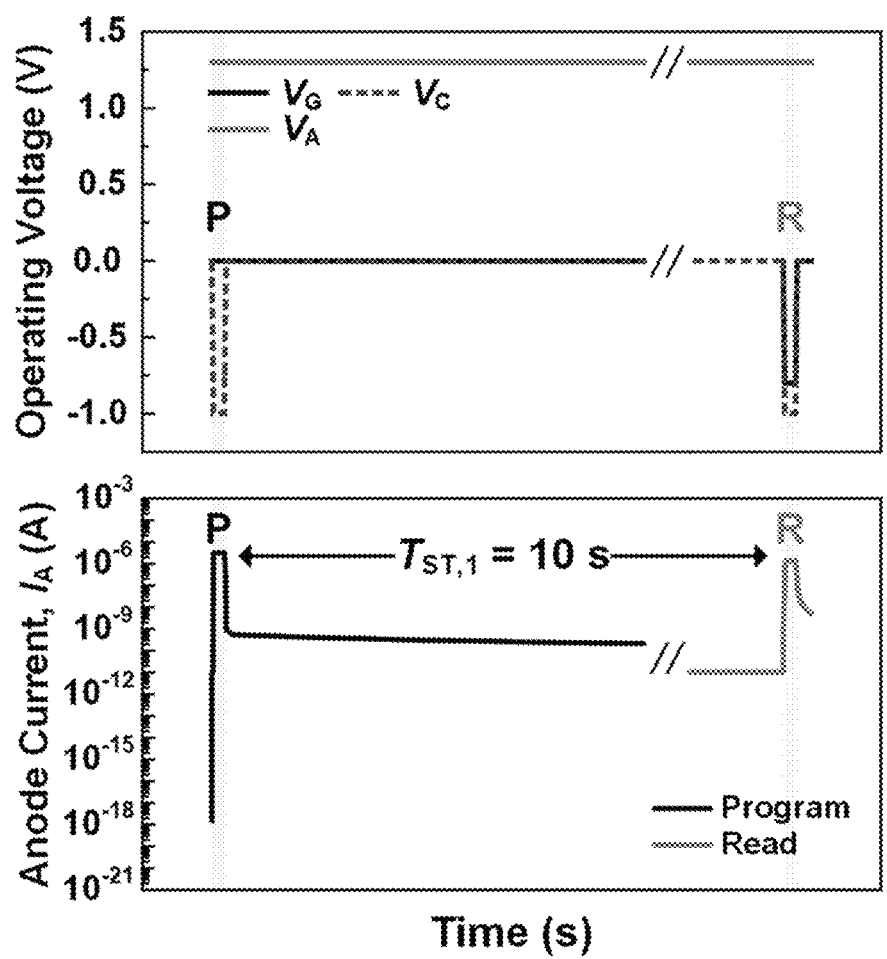
FIG. 20 shows the operating voltage and the anode current of a memory device of an embodiment when a read operation is performed 10 sec after program ($T_{ST, 1}$=10 s).

FIG. 20 shows the operating voltage and the anode current of the memory device of an embodiment when the read operation is performed 10 sec after program ($T_{ST,1}$=10 s). To accurately detect each memory state, the cathode voltage and the gate voltage are reduced to −1.0 V and −0.8 V respectively. Through this, the anode-cathode voltage $V_{AC,R}$ of 2.3 V and the gate-cathode voltage $V_{GC,R}$ of 0.2 V are applied to the memory device. The Low Resistance State (LRS) maintained after program may be detected at the high current level even after 10 seconds through the read voltage pulses.

Figure 21:
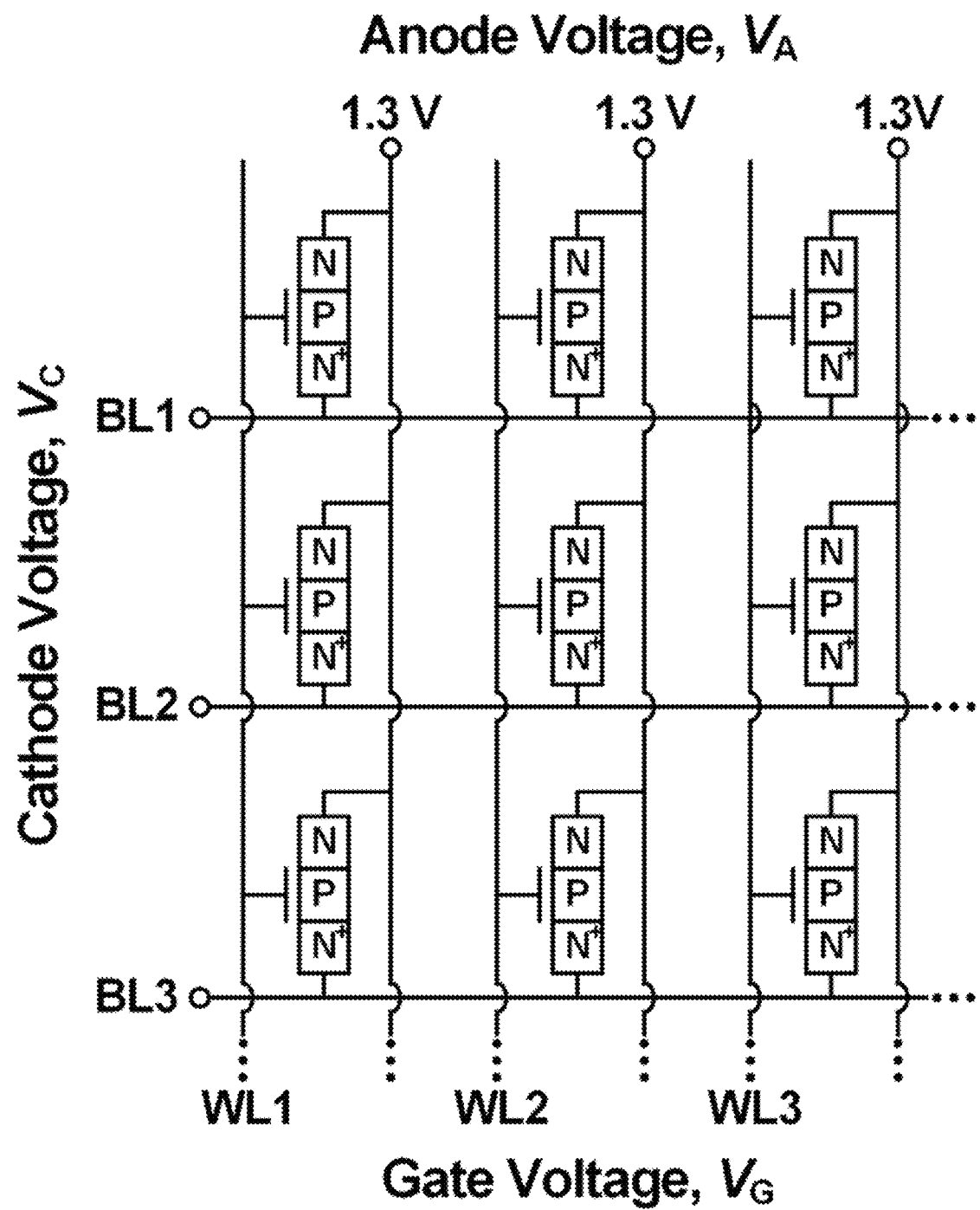
FIG. 21 is a schematic diagram of a memory cell array configuration using a memory device according to an embodiment of the present disclosure.

FIG. 21 is a schematic diagram of a memory cell array configuration using the memory device according to an embodiment of the present disclosure. When the gate-cathode voltage $V_{GC}$ is applied to an unselected device in the memory operation, it is possible to prevent unwanted operation errors. To effectively adjust the gate-cathode voltage $V_{GC}$ in the array configuration, the gate and the cathode are set by the word line WL and the bit line BL respectively, and for the standby state anode-cathode voltage $V_{AC,ST}$ that is capable of maintaining the Low Resistance State (LRS), the anode is fixed to 1.3 V.

Figures 22, 23:
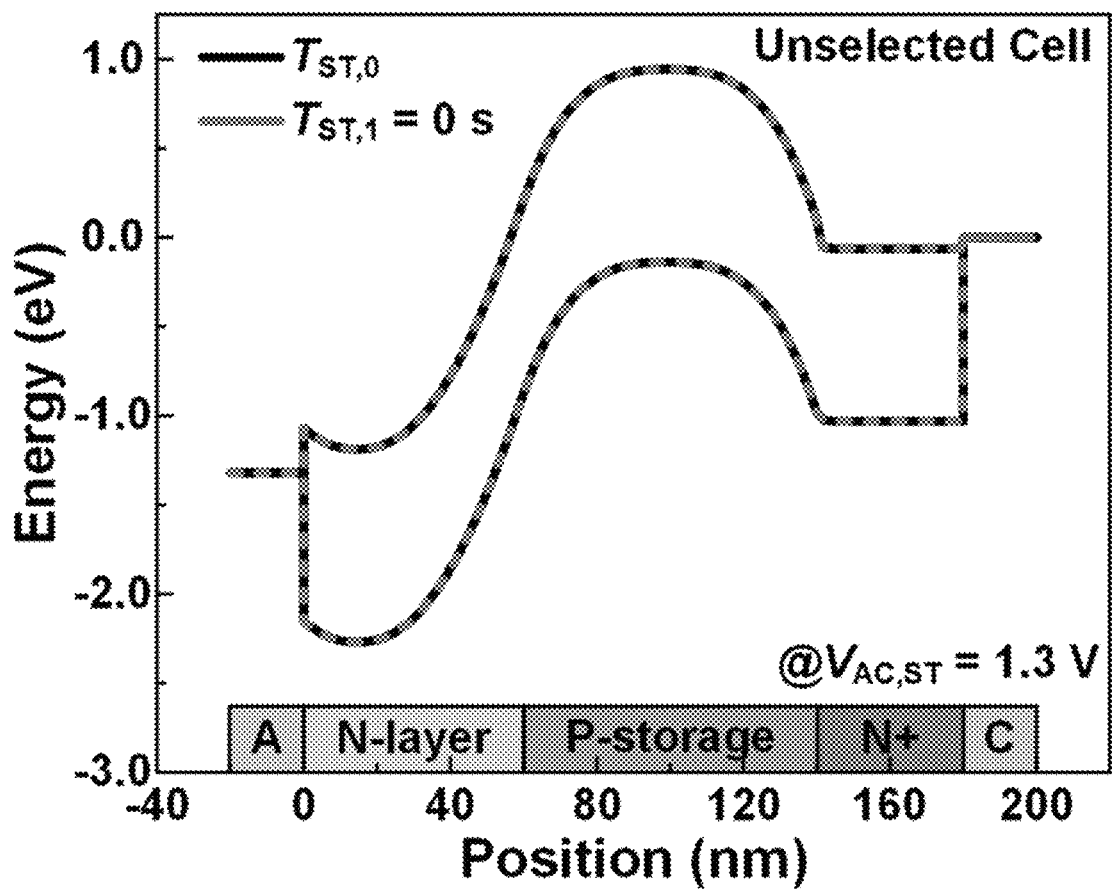
FIG. 22 is a table showing each operating voltage condition (anode, gate, cathode voltage) of a selected cell and an unselected cell according to each operation mode (standby, program, erase, read) of a device of an embodiment of the present disclosure.
FIGS. 23 to 25 show memory characteristics by array disturbance pulses that may occur in each operation mode of a device of an embodiment of the present disclosure.

FIG. 22 is a table showing each operating voltage condition (anode, gate, cathode voltage) of a selected cell and an unselected cell according to each operation mode (standby, program, erase, read) of the device of an embodiment of the present disclosure. To maintain the stable resistance state in the standby state, the gate voltage $V_G$ and the cathode voltage $V_C$ in the standby state are all set to 0.0 V.

Figure 24:
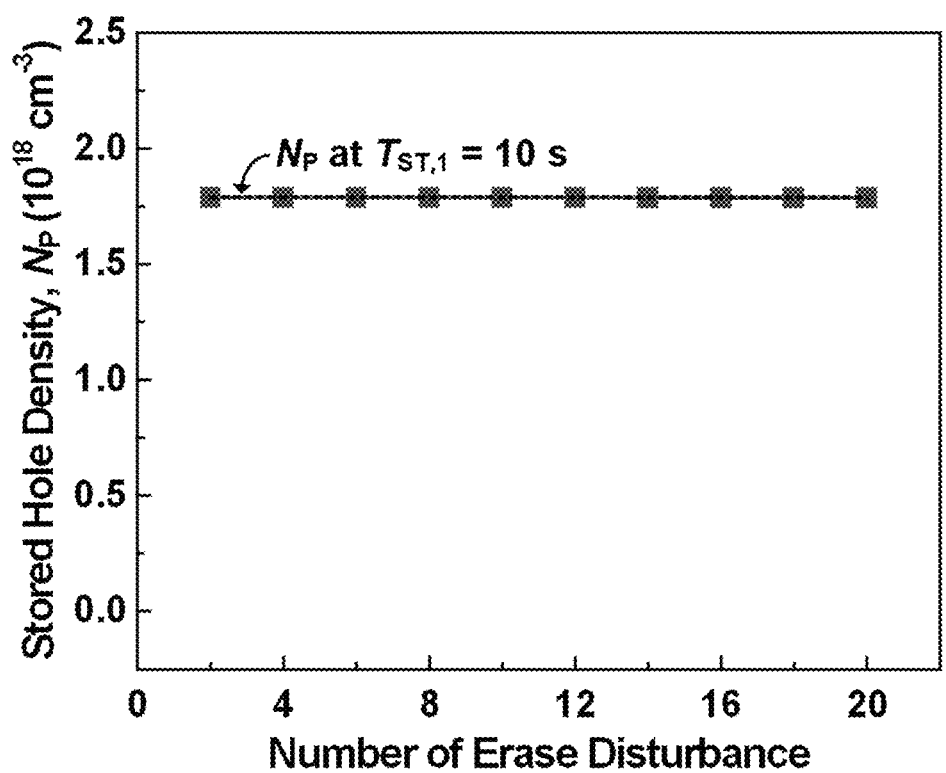
Figure 25:
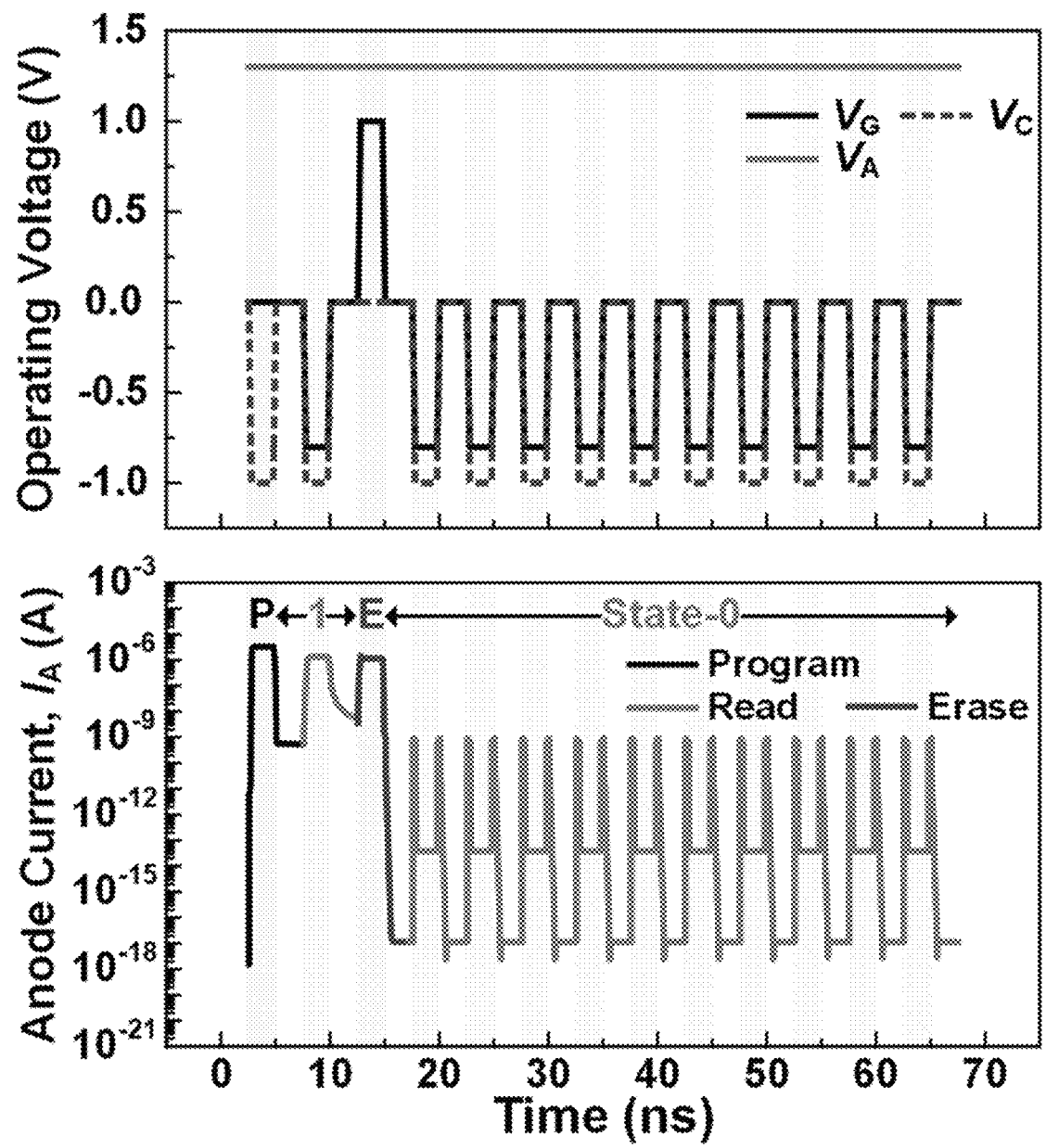

FIGS. 23 to 25 show the memory characteristics by array disturbance pulses that may occur in each operation mode of the device of an embodiment of the present disclosure.

FIG. 23 is an energy band diagram of the memory device of an embodiment by the application of the program disturbance pulses to the unselected cell during the program operation of FIG. 22. The program anode-cathode voltage $V_{AC,P}$ of 2.3 V and the gate-cathode voltage $V_{GC}$ of 0.0 V are applied to memory devices corresponding to a selected bit line BL and an unselected word line WL. When the gate-cathode voltage $V_{GC}$ of the unselected memory device is maintained below 0.0 V, there is no change in energy band before and after the program disturbance pulses, thereby preventing program disturbance-induced errors.

FIG. 24 shows the stored hole concentration NP in the memory device of an embodiment by repetition of erase disturbance pulses applied to the unselected cell during the erase operation of FIG. 22. The anode-cathode voltage VAC of 0.3 V and the gate-cathode voltage $V_{GC}$ of 0.0 V are applied to the selected word line WL and the unselected bit line BL. Since the gate-cathode voltage $V_{GC}$ is maintained below 0.0 V, the stored hole concentration in the programmed cell does not change in spite of the repeated erase disturbance pulses, thereby preventing erase disturbance-induced errors.

FIG. 25 shows the operating voltage and the anode current of the memory device of an embodiment by the repeated application of read pulses 10 times after the erase operation of FIG. 22. The read pulses of the anode-cathode voltage $V_{AC,R}$ of 2.3 V and the gate-cathode voltage $V_{GC,R}$ of 0.2 V are repeatedly applied to the erased memory device, but there is no change in the read current level, so High Resistance State (HRS) of the erased memory is stably maintained, thereby preventing read operation-induced program errors.

Figure 26:
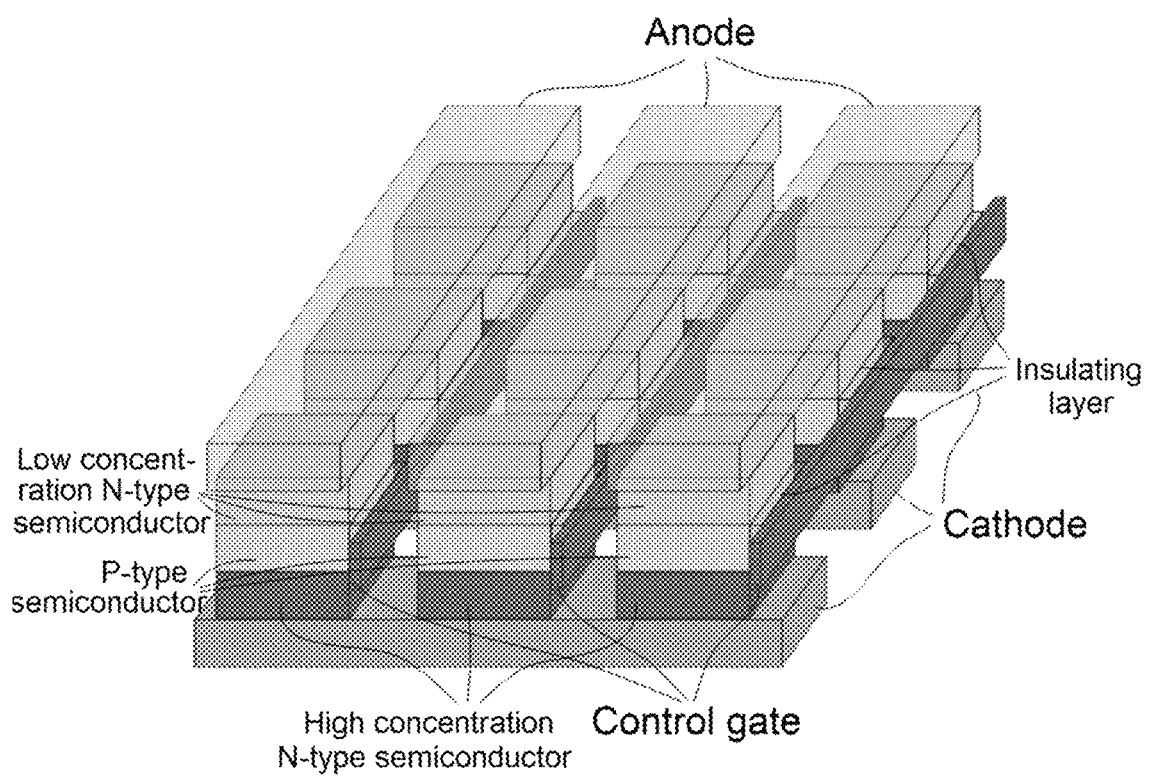
FIG. 26 is a diagram of a memory device array including the memory device of an embodiment as a unit device.

FIG. 26 is a diagram of a memory device array including the memory device of an embodiment as a unit device. Referring to FIG. 26, the memory device array including the memory device of an embodiment as a unit device is possible, and this is included in the scope of the present disclosure.

Additionally, the present disclosure provides an operation method of a memory device including a double PN junction and a control gate. The operation method includes selectively applying a program voltage to at least one memory device including a double PN junction; lowering the resistance of the semiconductor layer by lowering the potential barrier of the semiconductor layer by the program voltage to move carriers to the semiconductor layer; selectively applying an erase voltage to the memory device; returning the resistance of the semiconductor layer back to the initial level by erasing the carriers in the semiconductor layer by the erase voltage; and reading the resistance of the semiconductor layer.

That is, the present disclosure performs a data write operation by changing the resistance value of the semiconductor layer from high resistance to low resistance by the application of the program voltage to the memory device including the double PN junction and the control gate and changing the resistance value of the semiconductor layer from low resistance to high resistance by the application of the erase voltage. Additionally, the low resistance value of the semiconductor layer after the program operation may be stably maintained by applying the standby state anode-cathode voltage $V_{AC,ST}$ (1.3 V) that is capable of maintaining Low Resistance State (LRS) after program, and the low resistance state of the semiconductor layer may be verified by applying the read voltage. That is, data in the memory device may be verified.

The memory device operation method may effectively perform data write, erase, read and retention without using a separate complex structure such as a capacitor.

The invention claimed is:

1. A memory device including a double PN junction, comprising:
    at least one semiconductor layer having a double PN junction; and
    an anode and a cathode which simultaneously contact the semiconductor layer,
    wherein a junction between the semiconductor layer and the anode is a Schottky junction, and a junction between the semiconductor layer and the cathode is an Ohmic junction, and
    wherein the semiconductor layer is an NPN-type semiconductor layer, an N-type semiconductor layer of the NPN-type semiconductor layer is low concentration, and the other N-type semiconductor layer of the NPN-type semiconductor layer is high concentration.

2. The memory device including a double PN junction according to claim 1, wherein the NPN-type semiconductor layer comprises the N-type semiconductor layer, a P-type semiconductor layer, and the other N-type semiconductor layer.

3. The memory device including a double PN junction according claim 1, wherein the low concentration N-type semiconductor layer contacts the anode, and the high concentration N-type semiconductor layer contacts the cathode.

4. The memory device including a double PN junction according to claim 3, wherein a junction between the anode and the low concentration N-type semiconductor layer is the Schottky junction, and a junction between the high concentration N-type semiconductor layer and the cathode is the Ohmic junction.

5. A memory device array comprising the memory device according to claim 1 as a unit device.

6. An operation method of a memory device including a double PN junction, comprising:
   applying a program voltage to the memory device;
   lowering resistance of at least one semiconductor layer by lowering a potential barrier of the double PN junction by the program voltage to move carriers to the semiconductor layer; and
   reading the resistance of the semiconductor layer,
   wherein the memory device comprises:
   the semiconductor layer having the double PN junction; and
   an anode and a cathode which simultaneously contact the semiconductor layer, and
   wherein a junction between the semiconductor layer and the anode is a Schottky junction, and a junction between the semiconductor layer and the cathode is an Ohmic junction.

7. The operation method of a memory device according to claim 6, further comprising:
   after lowering the resistance of the semiconductor layer, increasing the resistance of the semiconductor layer by selectively applying an erase voltage to the memory device.

8. The operation method of a memory device according to claim 7, further comprising:
   after applying the program voltage,
   re-lowering the resistance of the semiconductor layer by selectively re-applying a refresh voltage to the memory device.

9. A capacitor-less memory device including a double PN junction and a control gate, comprising:
   at least one semiconductor layer having a double PN junction;
   a control gate which contacts the semiconductor layer; and
   an anode and a cathode which simultaneously contact the semiconductor layer,
   wherein a junction between the semiconductor layer and the anode is a Schottky junction, and a junction between the semiconductor layer and the cathode is an Ohmic junction,
   wherein the semiconductor layer is an NPN-type semiconductor layer, an N-type semiconductor layer of the NPN-type semiconductor layer is low concentration, and the other N-type semiconductor layer of the NPN-type semiconductor layer is high concentration, and
   wherein the low concentration N-type semiconductor layer contacts the anode, and the high concentration N-type semiconductor layer contacts the cathode.

10. A memory device array comprising the capacitor-less memory device according to claim 9 as a unit device.

11. An operation method of the capacitor-less memory device including a double PN junction and a control gate according to claim 9, the operation method comprising:
    applying a program voltage to the capacitor-less memory device;
    lowering resistance of the semiconductor layer by lowering a potential barrier of the double PN junction by the program voltage to move carriers to the semiconductor layer; and
    reading the resistance of the semiconductor layer.

12. The operation method of a capacitor-less memory device according to claim 11, further comprising:
    after lowering the resistance of the semiconductor layer, increasing the resistance of the semiconductor layer by selectively applying an erase voltage to the capacitor-less memory device.

13. The operation method of a capacitor-less memory device according to claim 11, further comprising:
    inhibiting, by the control gate, an operation error of an unselected cell in a memory cell array configuration formed using the capacitor-less memory device.

* * * * *